United States Patent [19]

Suzuki et al.

[11] Patent Number: 5,314,788
[45] Date of Patent: May 24, 1994

[54] MATRIX PRINTED BOARD AND PROCESS OF FORMING THE SAME

[75] Inventors: Hideyuki Suzuki, Machida; Masashi Kitani, Hiratsuka; Yuichi Masaki, Kawasaki; Kenji Morimoto, Ebina, all of Japan

[73] Assignee: Canon Kabushiki Kaisha, Tokyo, Japan

[21] Appl. No.: 76,705

[22] Filed: Jun. 15, 1993

Related U.S. Application Data

[63] Continuation of Ser. No. 782,764, Oct. 22, 1991, abandoned, which is a continuation of Ser. No. 562,444, Aug. 2, 1990, abandoned, which is a continuation of Ser. No. 308,941, Feb. 8, 1989, abandoned, which is a continuation of Ser. No. 168,550, Mar. 9, 1988, abandoned, which is a continuation of Ser. No. 5,828, Jan. 22, 1987, abandoned.

[30] Foreign Application Priority Data

| Jan. 24, 1986 | [JP] | Japan | 61-11983 |
| Jan. 24, 1986 | [JP] | Japan | 61-11984 |
| Jan. 24, 1986 | [JP] | Japan | 61-11985 |
| Jan. 24, 1986 | [JP] | Japan | 61-11986 |

[51] Int. Cl.$^5$ .............................................. B32B 9/00
[52] U.S. Cl. ............................... 430/313; 428/209; 427/96; 427/97; 427/98; 427/99; 430/311; 430/315; 430/325
[58] Field of Search .............. 430/311, 313, 315, 325; 427/96-99

[56] References Cited

U.S. PATENT DOCUMENTS

| 4,119,480 | 10/1978 | Nishi et al. | 156/272 |
| 4,211,603 | 7/1980 | Reed | 156/659.1 |
| 4,347,306 | 8/1982 | Takeda et al. | 427/96 |
| 4,424,251 | 1/1984 | Sugishita et al. | 428/209 |
| 4,464,420 | 8/1984 | Taguchi et al. | 427/96 |
| 4,547,455 | 10/1985 | Hiramoto et al. | 430/325 |
| 4,870,746 | 10/1989 | Klaser | 29/620 |

FOREIGN PATENT DOCUMENTS

| 0164921 | 10/1985 | European Pat. Off. | 428/901 |

Primary Examiner—Patrick J. Ryan
Assistant Examiner—Kam F. Lee
Attorney, Agent, or Firm—Fitzpatrick, Cella, Harper & Scinto

[57] ABSTRACT

A process of manufacturing a matrix printed board, comprising the steps of forming a first conductive layer on a substrate, forming an insulating layer on said first conductive layer, and forming a second conductive layer on said insulating layer by screen printing.

7 Claims, 5 Drawing Sheets

FIRST EXAMPLE

SECOND EXAMPLE

THIRD EXAMPLE
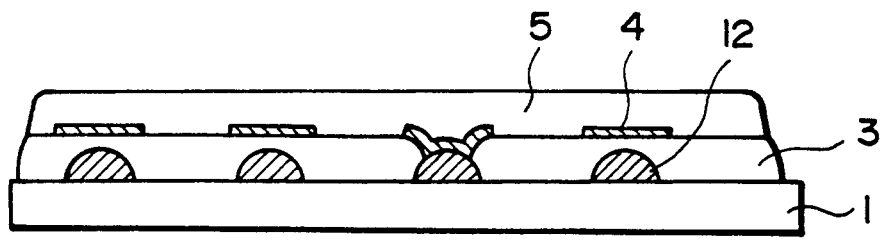
F I G. 12
F I G. 13
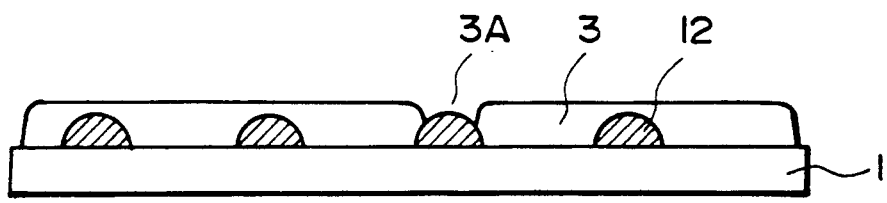
F I G. 14
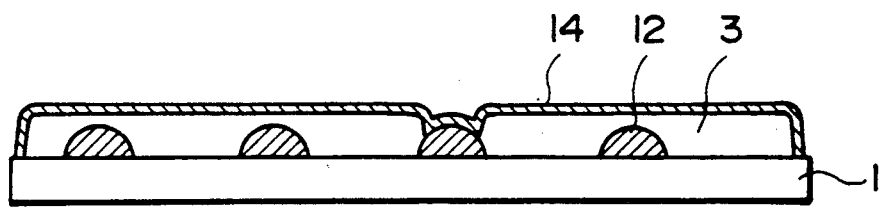
F I G. 15
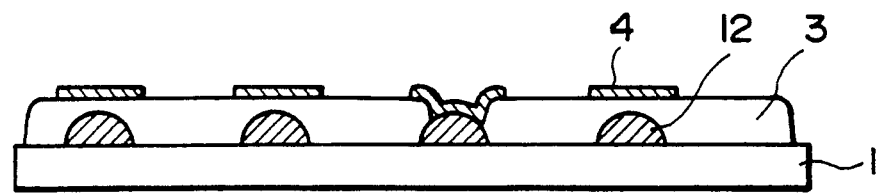
F I G. 16

FOURTH EXAMPLE

MATRIX PRINTED BOARD AND PROCESS OF FORMING THE SAME

This application is a continuation of U.S. patent application Ser. No. 07/782,764, filed Oct. 22, 1991, which is a continuation of U.S. patent application Ser. No. 07/562,444, filed Aug. 2, 1990, which is a continuation of U.S. patent application Ser. No. 07/308,941, filed Feb. 8, 1989, which is a continuation of U.S. patent application Ser. No. 07/168,550, filed Mar. 9, 1988, which is a continuation of U.S. patent application Ser. No. 07/005,828, filed Jan. 22, 1987, now all abandoned.

BACKGROUND OF THE INVENTION

1. Field of the Invention

The present invention relates to a matrix printed board which comprises an insulating layer and two conductive layers, i.e., a first conductive layer provided on one surface of the insulating layer and a second conductive layer provided on the other surface of the insulating layer, and a process of forming the same.

2. Related Background Art

Conventionally, manufacture of a matrix printed board uses two film-forming steps by for example evaporation and two photolithographic steps. However, this method reduces the yield and increases the manufacturing cost due to the use of a large scale manufacturing apparatus and many manufacturing steps.

There is another method which simplifies the manufacturing step by forming the first conductive layer using a thick film. This method, however, may create unevenness on the upper surface of the insulating layer formed on the thick-film conductive layer to thereby result in an improper second conductive layer pattern.

When the second conductive layers are formed by screen printing, improper conduction is likely to occur between a particular first conductive layer and an electrical connecting portion of a corresponding second conductive layer through which the second conductive layer contacts the particular first conductive layer, which will be a problem especially when a small electric current of about several hundreds of nanoamperes, for example, related to a photosensor, is handled. In such a case, it is necessary to plate with gold the surface of the first conductive layer which the electrical connecting portion of the second conductive layer contacts and to blush the contacting surface. This means an increase in the number of steps.

Conventionally in a matrix printed board of this type, the insulating layers disposed between the first and second conductive layers are formed by printing. In this case, the insulating layers are twice printed in order to prevent the occurrence of short-circuits between the first and second layers due to pinholes which may be formed in the insulating layer. However, the inclination, to the substrate, of a step portion formed at a through hole portion or the like in the insulating layer provided in order to allow for conduction between the particular first and second conductive layers becomes sharp. Especially when the second conductive layers are made of a thin film formed by evaporation or sputtering, a resist at a step portion formed by two insulating layers in the photolithographic step of forming a pattern for the second conductive layers subsequent to forming of the thin film for the second conductive layers by evaporation or sputtering becomes about three times as thick as a resist layer at portions other than at the step portion. Thus, if the quantity of exposure is adjusted to the thickness of the resist at the portions other than at the step portion, short-circuits may occur in the pattern portion for the step portion. On the other hand, if the quantity of exposure is adjusted to the thickness of the resist layer at the step portion, disconnections or open circuits may occur in the pattern portion for the portions other than at the step portion.

SUMMARY OF THE INVENTION

It is therefore an object of the present invention to provide a metho of manufacturing a matrix printed board which solves the above problems and simplifies the manufacturing process to reduce the manufacturing cost and to improve the yield.

It is another object of the present invention to provide a matrix printed board which ensures good contact between the particular first conductive layer and electrical connecting portion of the corresponding second conductive layer and hence is suitable for handling a large current, for example, related to a thermal head, as well as a small current of about several hundreds of nanoamperes, for example, related to a photosensor.

It is a further object of the present invention to prevent the occurrence of open circuits and/or short-circuits in patterning a film layer for the second conductive layer by preventing the occurrence of unevenness on the insulating layer surface to flatten the upper surface of the insulating layer.

It is a further object of the present invention to provide a matrix printed board which ensures good contact between the particular first conductive layer and the electrical connecting portion of the corresponding second conductive layer and hence is suitable for handling a large electric current, for example, related to a thermal head, and a small electric current of about 100 nanoamperes, for example, related to a photosensor, and a method of manufacturing the matrix printed board.

It is still another object of the present invention to provide a matrix printed board where neither short-circuits nor open circuits will occur.

The above objects are solved by the present invention.

In a first aspect of the present invention, the method of manufacturing a matrix printed board comprises the steps of forming a first conductive layer on a substrate, forming an insulating layer on the first conductive layer, and forming a second conductive layer by screen printing on the insulating layer.

In a second aspect of the present invention, a matrix printed board comprises a plurality of first thick line-like thick-film conductive layers disposed on a substrate, a plurality of first insulating layers, each disposed between adjacent first conductive layers, a second insulating layer covering said plurality of first insulating layers and said plurality of first conductive layers, and a second thin-film conductive layer disposed on said second insulating layer.

In a third aspect of the present invention, the method of manufacturing a matrix printed board comprises the steps of forming a plurality of first line-like conductive layers on a substrate by screen printing, forming a plurality of first insulating layers, each disposed adjacent first conductive layers, forming a second insulating layer covering said plurality of first insulating layers and said plurality of first conductive layers, and forming a second conductive layer on said second insulating layer.

In a fourth aspect of the present invention, a matrix printed board comprises a first thin-film conductive layer disposed on a substrate, an insulating layer disposed on said first conductive layer, and a second thin-film conductive layer disposed on said insulating layer.

In a fifth aspect of the present invention, a method of forming a matrix printed board comprises the steps of forming a first conductive layer on a substrate by screen printing, forming an insulating layer on said first conductive layer, and forming a second conductive layer on said insulating layer.

In a sixth aspect of the present invention, a matrix printed board comprises a first conductive layer disposed on a substrate, a first insulating layer disposed on said first conductive layer and having a hole through which an electrical contact portion of a particular first conductive layer is exposed, a second insulating layer disposed on the first insulating layer to cover the surface of the hole in the first insulating layer and having a hole through which the electrical contact portion is also exposed, and a second conductive layer disposed on the second insulating layer by a process including film-forming and photolithographic steps and having a portion extending through the holes in the insulating layers and electrically contacting the electrical contact portion of the first conductive layer.

BRIEF DESCRIPTION OF THE DRAWINGS

FIG. 12 shows the structure of a matrix printed board in a third example of the present invention.

FIGS. 13-16 show the sequential steps of manufacturing the matrix printed board of FIG. 12.

DETAILED DESCRIPTION OF THE PREFERRED EMBODIMENTS

Figure 1:
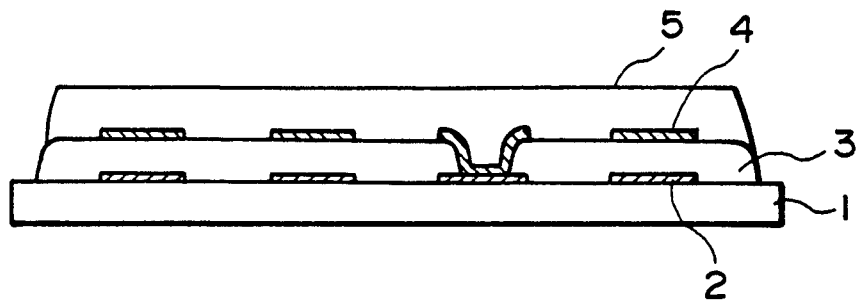
FIGS. 1-3 illustrate the structure of and problems with a prior art matrix printed board.

FIG. 1 illustrates one example of a prior art matrix printed board. In FIG. 1, reference numerals 1, 2, 3, 4 and 5 denote a substrate, for example, of glass, first conductive layers, an insulating layer of epoxy or polyimide resin, second conductive layers and a protective layer, respectively. In this board, the first and second conductive layers each include a thin film about several micrometers thick.

In more detail, the prior art board is formed by forming a film on a substrate 1 by evaporation or sputtering performing a patterning on the thin film using a sequence of photolithographic steps including coating photoresist, exposure and development, etching and removing the photoresist to thereby form the first conductive layers, forming the insulating layer several tens of micrometers thick on the first conductive layer by printing, and forming the second conductive layers using film-forming and photolithographic steps similar to those used for forming the first conductive layers.

In order to manufacture the prior art matrix printed board, however, it is necessary to use two film-forming steps and two photolithographic steps, as described above. Thus the yield is reduced and the manufacturing cost increases due to the use of a large scale manufacturing equipment and many manufacturing steps.

Figure 2:
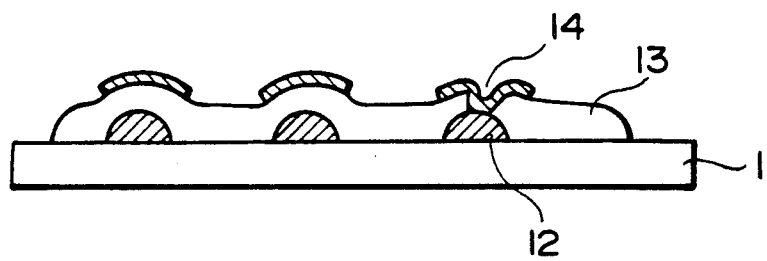

On the other hand, as shown in FIG. 2, one could consider forming the insulating layers 13 and then, by sputtering, second conductive layers 14 after the first conductive layers are formed by screen printing. This method eliminates the prior art complicated process of using film-forming and photolithographic steps to form the first conductive layers, namely, simplifying the whole manufacturing process, and provides a high physical strength and a large area where the first and second conductive layers contact to thereby ensure good contact at the area.

In order to construct the matrix printed board in which the first conductive layers 12 are formed of a thick film, as described above, first, a plurality of first conductive layers 12 each having a thickness of about 20 micrometers with a spacing of several hundreds of micrometers between adjacent first conductive layers is formed by screen printing, and insulating layer 13 having a thickness of about 30 micrometers is then formed on the first conductive layers 12. In this case, however, as shown in FIG. 2, unevenness will occur on the surface of the insulating layer 13 due to alternate arrangement of raised first conductive layers 12 and recessed spacing portions. Thus, subsequently, when the second conductive layers 14 are formed especially by forming a thin film of about several micrometers by evaporation or sputtering and then performing a patterning using photolithography, unevenness will appear on the thin film even in the patterning in accordance with the unevenness on the insulating layer 13.

Figure 3:
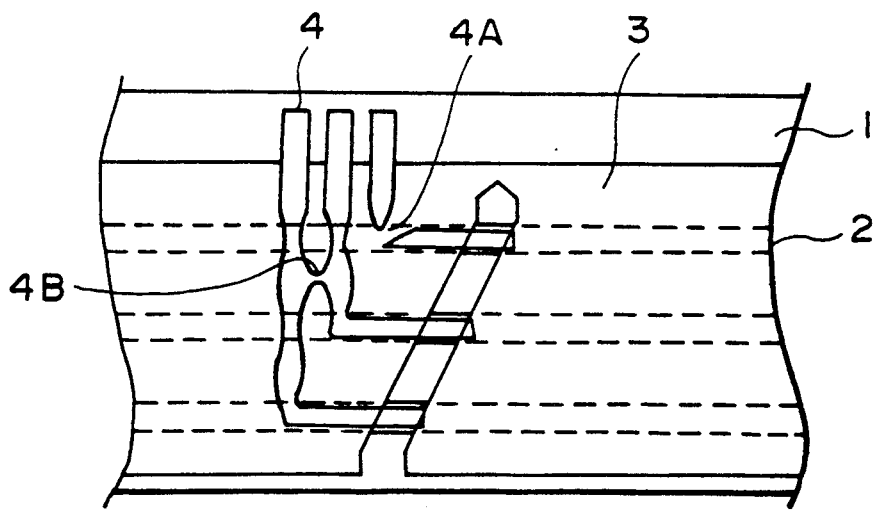

Thus this unevenness will cause variations in the thickness of the photoresist layer and improper exposure which in turn may create a bad pattern, namely, open circuits 4A and/or short-circuits 4B in the second conductive layers 14, as shown in FIG. 3.

Preferred Embodiments

First Example

Figure 4:
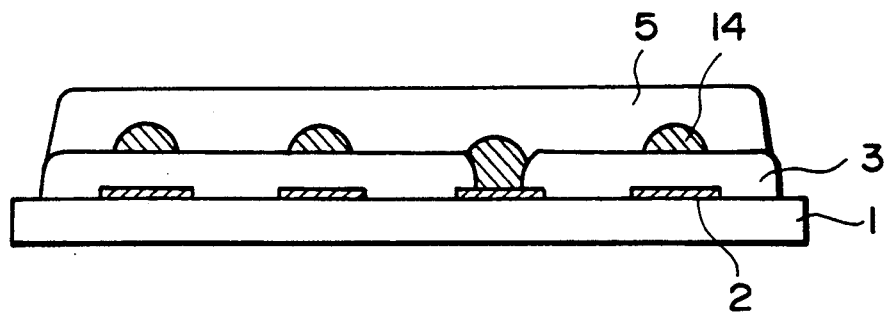
FIG. 4 shows the structure of a matrix printed board in a first example of the present invention.

FIG. 4 illustrates an example of a matrix printed board according to the present invention. Elements similar to those of the prior art board of FIG. 1 are similarly numbered. Reference numeral 14 denotes second thick-film conductive layers peculiar to this example.

Figure 5:
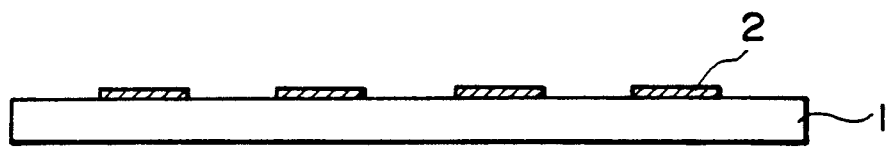
FIGS. 5-7 illustrates the sequential steps of manufacturing the matrix printed board of FIG. 1.
Figure 6:
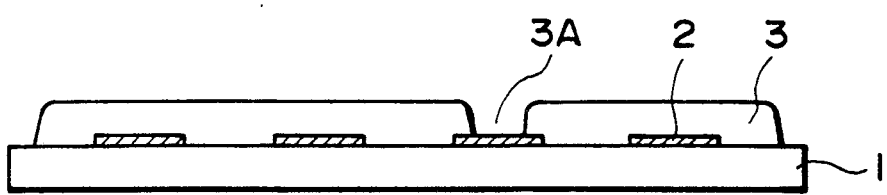
Figure 7:
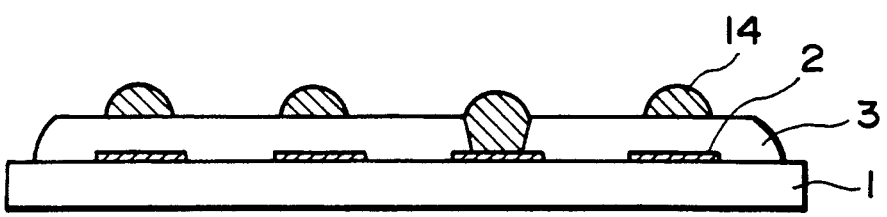

FIGS. 5-7 illustrate a series of steps for manufacturing the matrix printed board shown in FIG. 4.

First, as shown in FIG. 5, a first conductive layer of a conductive material such as aluminum is formed to a thickness of several micrometers by evaporation, sputtering or the like. Then a pattern is formed by photolithography. Next, as shown in FIG. 6, insulating layer 3 of epoxy or polyimide resin having through holes 3A through which first and second conductive layers are allowed to electrically connect is formed to a thickness of about 30 micrometers using screen printing, for example.

Next, as shown in FIG. 7, the second conductive layers are formed by screen-printing a conductive paste, for example, silver or copper in a proper alignment so that the electrical connecting portion of a particular one of the resulting second conductive layers extend through hole 3A to contact the corresponding first conductive layer.

Finally, printing is performed on protective layer 5 and the matrix printed board as shown in FIG. 4 is obtained.

As described above, the second conductive layers are formed by screen printing, so that the process of manufacturing the matrix printed board is simplified compared to the prior art process including film-forming and photolithographic steps for forming the second conductive layer.

Second Example

Figure 8:
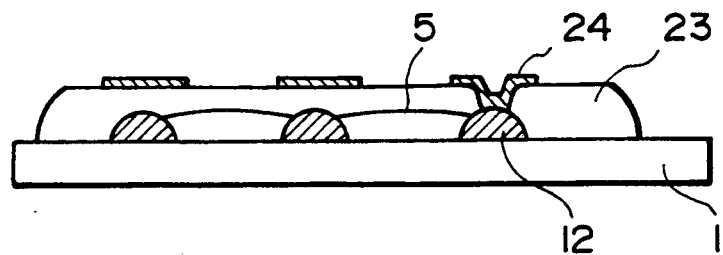
FIG. 8 illustrates the structure of a matrix printed board in the second embodiment of the present invention.

FIG. 8 illustrates an example of the structure of a matrix printed board according to the present invention. Elements corresponding to those in FIGS. 1-3 are similarly numbered. Reference numeral 5 denotes a plurality of insulating layers peculiar to this embodiment. Each of the insulating layers is formed between adjacent first thick-film conductive layers 12 (each insulating layer 5 is hereinafter referred to as the inter-line insulating layer).

Figure 9:
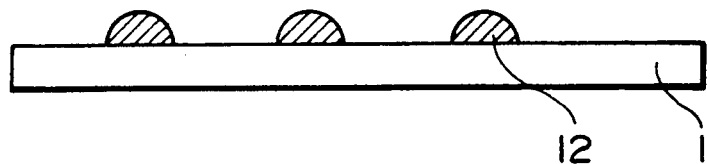
FIGS. 9-11 illustrates the sequential steps of manufacturing the matrix printed board of FIG. 8.
Figure 10:
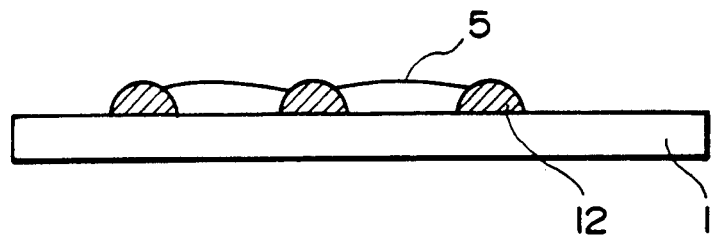
Figure 11:
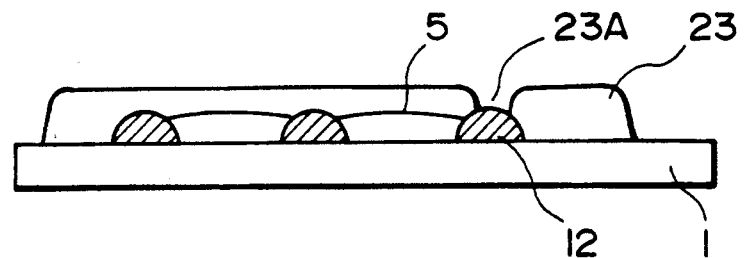

FIGS. 9-11 illustrate one example of a series of steps for manufacturing the matrix printed board shown in FIG. 8. First, as shown in FIG. 9, first thick-film conductive layers 12 are formed on substrate 1 using a conductive paste, for example, of silver or copper, by screen printing. In this example, the thickness of first conductive layers 12 is was about 20 micrometers.

Next, as shown in FIG. 10, printing is performed on inter-line insulating layers 5 in consideration of the thickness of first layers 12. The inter-line insulating layers 5 may be made of polyimide or epoxy resin. Printing conditions, a screen and a pattern in the screen, etc., can be appropriately selected in printing the inter-line insulating layers 5 so that the insulating layers 5 bury the portions among the layers 12 and the height of the layers 5 is lower than that of the layers 12 by a few micrometers. In this example, the first conductive layers 12 were 200 micrometers wide, the inter-line insulating layer was 150 micrometers wide, the mesh of the printing plate was #400, the interline line insulating layer 5 was 100 micrometers wide, the spacing between adjacent insulating layers 5 was 250 micrometers wide and the mesh of the printing plate was #200. Thus, each spacing between adjacent first conductive layers 12 is filled and the whole composite layer on the board 1 is limited to about 15 micrometers.

Furthermore, as shown in FIG. 11, when printing is performed on insulating layer 23 which has a through hole 23A through which electrical connection can be established between first and second conductive layers 12 and 24, a pattern having a flattened surface is formed. Thus when a thin film of a conductive material such as aluminum, formed by evaporation or sputtering after formation of the just mentioned pattern, is patterned to form second thin-film conductive layers 24, the occurrence of open circuits and/or short-circuits due to unevenness on the insulating layer surface is prevented.

In the matrix printed board shown in FIG. 8, first conductive layers 12 were formed by printing, so that complicated steps such as the film-forming and photolithographic steps in the prior art process for forming first conductive layers were eliminated.

Second conductive layers 24 are formed over first conductive layers 12 of silver or copper paste by sputtering wherein electrical connecting portion of the second conductive layer extends through through hole 23A and contacts the corresponding first conductive layer with higher physical strength than in the formation of the second conductive layers, for example, by printing. Compared to the prior art board where the first and second conductive layers are made of a thin film, the first conductive layers 12 of this example are of a thick film, so that a larger contact area with the second conductive layer is obtained. Thus good contact is ensured between the particular first conductive layer and the electrical connecting portion of the corresponding second conductive layer to thereby prevent bad conduction which would otherwise occur between the first and second conductive layers.

As described above, according to the second example, the process of manufacturing the matrix printed board is simplified, the manufacturing cost is reduced and the yield is increased. In addition, good contact is ensured between the particular first conductive layer and the electrical connecting portion of the corresponding second conductive layer, so that bad conduction which may occur in handling a small electric current is prevented. The upper surface of the insulating layer to insulate the first conductive layers from the second conductive layers is flattened, so that the occurrence of open circuits and/or short-circuits in formation of the second conductive layers is prevented.

Third Example

FIG. 12 illustrates another example of the structure of a matrix printed board according to the present invention. Elements corresponding to those of the prior art matrix printed board of FIG. 1 are similarly numbered. In FIG. 12, reference number 12 denotes first conductive layers of a thick film.

FIGS. 13-16 illustrate one example of a series of steps for manufacturing the matrix printed board of FIG. 12, First, as shown in FIG. 13, first conductive layers 12 are obtained by forming a pattern to a thickness of about 15 micrometers on substrate 1 of glass, ceramic or the like, using a conductive paste of silver or copper by screen printing.

Next, as shown in FIG. 14, insulating layer 3 having through holes 3A through which first and second conductive layers are allowed to electrically connect is formed to a thickness of about 30 micrometers by screen printing.

As shown in FIG. 15, a film 14 of a conductive material such as aluminum is then formed to a thickness of about 1 micrometer on insulating layer 3 by sputtering. The electric power required for this sputtering depends on the ability and shape of a sputtering device used. In this example, sputtering was performed under the conditions of 12 amperes and 550 volts. By this sputtering, film 14 of a conductive material such as aluminum is formed over first conductive layers 12 of a conductive paste of silver, copper or the like with the electrical connecting portion extending through through hole 3A and contacting the first conductive layer. Therefore, the electrical connecting portion contacts the particular first conductive layer with higher physical strength than when the second conductive layers are formed, for example, by printing. Compared to formation of the first and second conductive layers out of a thin film as in the prior art, a larger contact area with film 14 or second conductive layers 4 is obtained since first conductive layers 12 are of a thick film in this example. Therefore, good contact is ensured between the particular first conductive layer and the electrical connecting portion of the corresponding second conductive layer to prevent the occurrence of bad possible conduction at the contact areas. Next, as shown in FIG. 16, the second conductive layers are formed by performing a patterning on film 14 by photolithographic process, and protective layer 5 is formed by screen printing to provide the matrix printed board as shown in FIG. 12.

As described above, according to the third example, the process of manufacturing the matrix printed board is simplified, the manufacturing cost is reduced, and the yield is improved.

According to this invention, good contact is ensured between the particular first conductive layer and the electrical connecting portion of the corresponding second conductive layer, so that the failure of good contact in handling a small electric current can be prevented.

Fourth Example

Figure 17:
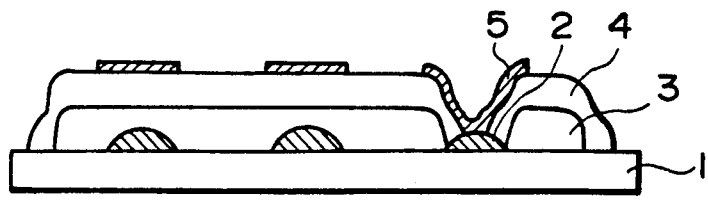
FIG. 17 shows the structure of a matrix printed board in a fourth example of the present invention.

FIG. 17 illustrates a further example of the structure of a matrix printed board according to this invention. In FIG. 17, reference numeral 1 denotes a substrate of glass, ceramic or the like. Reference numeral 2 denotes first conductive layers of a conductive paste, for example, of silver or copper printed on substrate 1. Reference numerals 3 and 4 denote first and second insulating layers, respectively, of epoxy or polyimide resin formed, for example, by screen printing. Reference numeral 5 denotes second conductive layers formed by film-forming and photolithographic steps.

Figure 18:
FIGS. 18-20 illustrate the sequential steps of manufacturing the matrix printed board of FIG. 17.
Figure 19:
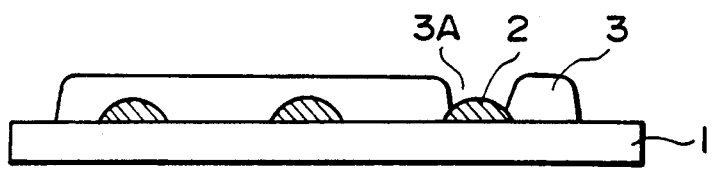
Figure 20:
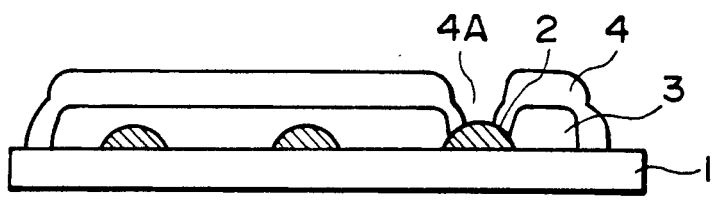

FIGS. 18-20 illustrates one example of series of steps for manufacturing the matrix printed board shown in FIG. 17. First, as shown in FIG. 18, a conductive paste is printed on substrate 1 by screen printing to provide first conductive layers 2.

Next, as shown in FIG. 19, insulating layer having through hole 3A through which the electrical connecting portion of second conductive layer 5 can extend and contact the particular first conductive layer 2 is formed by screen printing using insulating resin. In this example, the insulating layer 3 was 15-20 micrometers thick.

As shown in FIG. 20, insulating layer 4 having through hole 4A is then formed similarly by screen printing. At this time, in this example, the entire printing pattern was extended by about 150 micrometers compared to the printing pattern for the insulating layer 3 formed first. Then, second conductive layers 5 are formed on insulating layer 4 by film-forming and photolithographic steps to provide the matrix printed board shown in FIG. 17.

Figure 21:
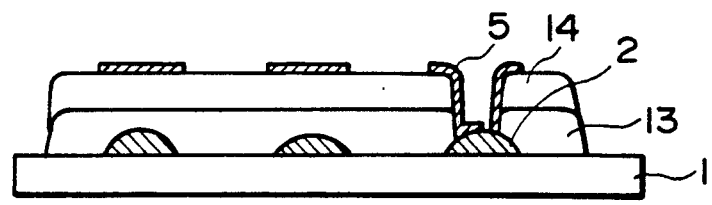
FIG. 21 shows the structure of a matrix printed board wherein the second insulating layer is formed in the same pattern as the first insulating layer.
Figure 22:
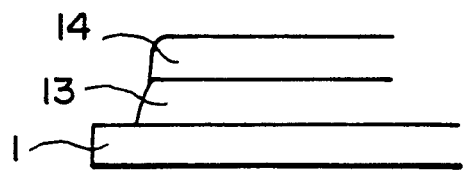
FIGS. 22 and 23 illustrate the respective shapes of step portions at the matrix printed boards of FIGS. 21 and 17.
Figure 23:
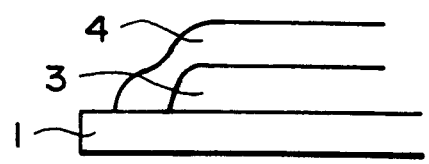

Thus, as shown in FIGS. 21 and 22, the inclination of a step portion is reduced as shown in FIG. 23, compared to the case where an insulating layer 14 having the same pattern as insulating layer 13 is provided on insulating layer 13, as shown in FIGS. 21 and 22. Thus formation of the second conductive layer is easy, and the occurrence of open circuits and/or short-circuits is prevented to ensure formation of a reliable pattern.

More specifically, when the same pattern as was used for forming the insulating layer 13 was used for forming the insulating layer 14, the inclination angle, to substrate 1, of the step portion extending from the upper surface of substrate 1 to the upper surface of insulating layer was about 20° degrees while when a different pattern is used as in this example, the inclination angle can be reduced to about 6° degrees. Therefore, when in the subsequent step the second conductive layers are formed out of a thin film by evaporation or sputtering, the thickness of a resist at the step portion at the insulating layer can be reduced to half of that of the resist at the insulating layer formed in the prior art manner, at the photolithographic step in which the pattern for the second conductive layers is formed. Thus open circuits and/or short-circuits which may occur in the prior art patterning is eliminated.

While this example has been described wherein the first conductive layers are formed out of a thick film by pattern printing, this particular method is very advantageously applicable to the formation of a matrix printed board wherein the first conductive layers are formed out of a thin film by a process including film-forming and photolithographic steps.

As described above, according to the fourth example, the pattern used for forming the second insulating layer is different from that used for forming the first insulating layer to thereby reduce the inclination of the step portion at the through hole, so that the pattern for the second conductive layers is formed easily and reliably, thereby resulting in a highly reliable matrix printed board.

What is claimed is:

1. A process of manufacturing a matrix printed board, comprising the steps of:
    forming a first conductive layer on a substrate by screen printing:
    forming a first insulating layer on said first conductive layer, said first insulating layer having a hole through which an electrical contact portion of said first conductive layer is exposed;
    forming a second insulating layer on said first insulating layer, said second insulating layer having a hole corresponding to the hole in said first insulating layer through which an electrical contact portion of said first conductive layer is exposed, wherein an angle of inclination, with respect to an upper surface of the substrate, of the hole formed by said first insulating layer is greater than an angle of inclination of the hole formed by said second insulating layer; and
    forming a second conductive layer on said second insulating layer.

2. A process of claim 1, wherein said second conductive layer is formed by photolithography.

3. A process according to claim 1, wherein said first and second insulating layers are formed by a printing step.

4. A process according to claim 3, wherein the printing step is screen printing.

5. A process according to claim 1, wherein the hole formed in the first insulating layer is sized larger than the hole formed in the second insulating layer.

6. A process according to claim 1, wherein the insulating layers are made of a resin selected from an epoxy resin or polyimide resin.

7. A process according to claim 3, wherein the second conductive layer is patterned by a printing step.

* * * * *

UNITED STATES PATENT AND TRADEMARK OFFICE
CERTIFICATE OF CORRECTION

PATENT NO. : 5,314,788
DATED : May 24, 1994
INVENTOR(S) : Suzuki et al.

It is certified that error appears in the above-indentified patent and that said Letters Patent is hereby corrected as shown below:

COLUMN 2:

Line 12, "metho" should read --method--.

COLUMN 5:

Line 49, "was#400" should read --was #400--.
Line 52, "was#200" should read --was #200--.

COLUMN 8:

Line 5, "6° degrees." should read --6 degrees.--.

Signed and Sealed this

Thirteenth Day of December, 1994

Attest:

BRUCE LEHMAN

*Attesting Officer*  *Commissioner of Patents and Trademarks*